(12) United States Patent
Xu et al.

(10) Patent No.: US 10,976,670 B2
(45) Date of Patent: Apr. 13, 2021

(54) APPARATUS AND METHOD FOR DETECTING OPTIMAL FOCAL PLANE OF LITHOGRAPHIC PROJECTION OBJECTIVE LENS

(71) Applicant: The Institute of Optics and Electronics, The Chinese Academy of Sciences, Sichuan (CN)

(72) Inventors: Jiajun Xu, Chengdu (CN); Zhixiang Liu, Chengdu (CN); Tingwen Xing, Chengdu (CN); Wumei Lin, Chengdu (CN)

(73) Assignee: The Institute of Optics and Electronics, The Chinese Academy of Sciences, Chengdu (CN)

( * ) Notice: Subject to any disclaimer, the term of this patent is extended or adjusted under 35 U.S.C. 154(b) by 0 days.

(21) Appl. No.: 16/729,189

(22) Filed: Dec. 27, 2019

(65) Prior Publication Data

US 2020/0225588 A1    Jul. 16, 2020

(30) Foreign Application Priority Data

Jan. 10, 2019   (CN) .......................... 201910026093.8

(51) Int. Cl.
*G03F 7/20*   (2006.01)
*G02B 27/10*  (2006.01)

(52) U.S. Cl.
CPC ...... *G03F 7/70258* (2013.01); *G03F 7/70308* (2013.01); *G02B 27/10* (2013.01)

(58) Field of Classification Search
CPC .......................... G03F 7/70258; G03F 7/70308
USPC ............................................... 355/52, 53, 55
See application file for complete search history.

(56) References Cited

U.S. PATENT DOCUMENTS

| 9,188,874 | B1* | 11/2015 | Johnson | G03F 7/70291 |
| 9,605,947 | B2* | 3/2017 | Kreuzer | G03F 9/7088 |
| 2009/0021845 | A1* | 1/2009 | Shmarev | G01N 21/47 |
| | | | | 359/730 |
| 2017/0293229 | A1* | 10/2017 | Godfried | G03F 7/7085 |

* cited by examiner

*Primary Examiner* — Hung Nguyen
(74) *Attorney, Agent, or Firm* — Davis Wright Tremaine LLP; Michael J. Donohue

(57) ABSTRACT

An apparatus and a method for detecting an optimal focal plane of a lithographic projection objective lens, the apparatus including: an illumination device, a beam splitting device, a lens array, a mask plate, a reflecting device, a photoelectric detector and a controller. The illumination device generates a collimated beam, which is transmitted through the beam splitting device, focused by the lens array to the mask plate for spatial-filtering, and delivered to the lithographic projection objective lens. The reflecting device reflects a focused beam passing through the lithographic projection objective lens to generate a reflected beam. The photoelectric detector detects an intensity of the reflected beam from the reflecting device after being spatial-filtered via the mask plate and generates a beam intensity signal. The controller controls a movement of a workpiece table and/or collects the beam intensity signal generated by the photoelectric detector.

7 Claims, 3 Drawing Sheets

APPARATUS AND METHOD FOR DETECTING OPTIMAL FOCAL PLANE OF LITHOGRAPHIC PROJECTION OBJECTIVE LENS

TECHNICAL FIELD

The invention relates to the field of lithography, and in particular relates to an apparatus and a method for detecting an optimal focal plane of a lithographic projection objective lens.

BACKGROUND

The development of the integrated circuit industry is closely related to the advancement of lithography. As a key device in the manufacturing process of integrated circuits, a lithography machine shrinks a circuit structure on a mask plate onto a photoresist-covered silicon wafer. The imaging quality determines a physical size of a single device directly. In order to achieve an optimal exposure effect, the photoresist-covered silicon wafer is required to coincide with an optimal focal plane of a lithographic projection objective lens. Therefore, after a lithographic projection lens system is integrated, it is necessary to detect the position of the optimal focal plane accurately.

One method for detecting the optimal focal plane of the lithographic projection objective lens is to determine the position according to the clarity of exposed lines, by exposing a special mask image at different imaging positions. This method is relatively complex and requires a post-processing on the images after the exposure, which is time-consuming and has a poor real-time performance. In addition, due to the use of additional silicon wafers and exposure process materials during the detection process, an economic cost is increased.

Therefore, there is a need for an apparatus and a method for detecting an optimal focal plane of a lithographic projection objective lens, which may be economic and also have a good real-time performance.

SUMMARY

In order to at least partially solve the above mentioned problems, the present disclosure provides an apparatus and a method for detecting an optimal focal plane of a lithographic projection objective lens.

According to an aspect of the disclosure, there is provided an apparatus for detecting an optimal focal plane of a lithographic projection objective lens, comprising: an illumination means configured to generate a collimated beam; a beam splitting means configured to transmit the beam emitted from the illumination means; a lens array configured to focus the beam output from the beam splitting means; a mask plate, wherein the beam output from the lens array is focused on the mask plate and passes through the mask plate to be incident on the lithographic projection objective lens, and wherein the mask plate is configured to perform spatial-filtering; a reflecting device configured to reflect a focused beam passing through the lithographic projection objective lens to generate a reflected beam, so that the reflected beam is reflected on the beam splitting means, and is collimated through the lens array; a photoelectric detector configured to detect an intensity of the reflected beam from the reflecting device after being spatial-filtered via the mask plate and to generate a beam intensity signal; and a controller connected to the photoelectric detector and configured to control a movement of a workpiece table and/or collect the beam intensity signal generated by the photoelectric detector.

In some embodiments of the disclosure, the apparatus may further comprise: a mounting means for objective lens, configured to fix the lithographic projection objective lens; and the workpiece table connected to the controller and configured to adjust a posture and a position of the reflecting device.

In some embodiments of the disclosure, the lens array is two-dimensionally distributed and has lenses with the same focal length, and wherein the lenses of the lens array are the same and/or different from each other.

In some embodiments of the disclosure, the mask plate is provided with a pinhole array having a distribution form as same as the lens array.

In some embodiments of the disclosure, the reflecting device has a reflecting surface made of any one of a glass plane, a silicon wafer or other coated planes.

In some embodiments of the disclosure, the photoelectric detector comprises a single photoelectric detector and/or a plurality of photoelectric detectors arranged in an array.

In some embodiments of the disclosure, the workpiece table has three degrees of freedom which respectively control a reflecting surface of the reflecting device to be perpendicular to an optical axis of the lithographic projection objective lens, and an axial movement of the reflecting device.

According to another aspect of the disclosure, there is provided a method for detecting an optimal focal plane of a lithographic projection objective lens, comprising:

step 1: adjusting a direction of a beam emitted from an illumination means to be in parallel to a direction of an optical axis of the lithographic projection objective lens, adjusting a lens array and a mask plate to be perpendicular to the direction of the optical axis, and adjusting the mask plate to be coincident with a focal plane of the lens array;

step 2: adjusting a reflecting surface of a reflecting device to be perpendicular to the optical axis of the lithographic projection objective lens, wherein a distance between the reflecting surface of the reflecting device and the lithographic projection objective lens is D, and a deviation between D and a nominal working distance $D_0$ of the lithographic projection objective lens is $\delta$, $$\delta = D - D_0$$

wherein a photoelectric detector is provided to detect a reflected beam signal sequentially passing through the reflecting device, the lithographic projection objective lens, the mask plate, the lens array, and a beam splitting means;

step 3: moving the reflecting device along the direction of the optical axis of the lithographic projection objective lens to decrease $|\delta|$, until the distance between the reflecting surface of the reflecting device and the lithographic projection objective lens becomes D', so that $D_0$ is between D and D', wherein the deviation between D' and the nominal working distance $D_0$ of the lithographic projection objective lens is $\delta'$, $$\delta' = D' - D_0$$

wherein during the movement of the reflecting device, a controller collects, in real time, an intensity $I_{ij}$ of the reflected beam detected by the photoelectric detector under each field of view, and establishes a relationship $G_{ij}$ between the intensity $I_{ij}$ of the reflected beam and a distance t between the reflecting device under each field of view and the lithographic projection objective lens, $$I_{ij} = G_{ij}(t), t \in [D_0 + \delta, D_0 + \delta']$$

wherein i and j refer to indices of fields of view and are determined according to a distribution form of lenses on the lens array; and step 4: for a single field of view $P_{ij}$ when the intensity $I_{ij}$ of the reflected beam is maximum, the distance between the reflecting device and the lithographic projection objective lens is an optimal focus position $T_{ij}$ for the corresponding field of view, $$G_{ij}(t)|_{t=T_{ij}} = \text{Max}(I_{ij})$$

wherein the optimal focal plane of the lithographic projection objective lens is at a position T which is an average of the optimal focus positions $T_{ij}$ for respective fields of view, $$T = \frac{\sum\sum T_{ij}}{N}$$

wherein N is the number of fields of view, that is, the number of the lenses in the lens array.

In some embodiments of the disclosure, in step 1, the mask plate is provided with an array of pinholes at positions being coincident with positions of spots focused by the lens array.

In some embodiments of the disclosure, in step 1, the lithographic projection objective lens is connected to a mounting means for objective lens, the reflecting device is connected to a workpiece table, and the movement of the workpiece table is controlled by the controller.

It can be seen from the above technical solutions that the apparatus and method for detecting an optimal focal plane of a lithographic projection objective lens in the present disclosure at least may have one or a part of the following beneficial effects.

By utilizing the movement of the reflecting device along the direction of the optical axis of the lithographic projection objective lens, the present disclosure is capable of detecting the position of the optimal focal plane of the lithographic projection objective lens according to a change in an intensity of reflected beam under each field of view, which can have a good real-time performance and a lower economic cost.

| 1-illumination means; | 2- beam splitting means; |
| --- | --- |
| 3-lens array; | 4-mask plate; |
| 5-lithographic projection objective lens; | 6-objective lens fixture; |
| 7- reflecting device; | 8-workpiece table; |
| 9-photoelectric detector; | 10-controller. |

DETAILED DESCRIPTION

The present disclosure provides an apparatus and a method for detecting an optimal focal plane of a lithographic projection objective lens, the apparatus comprising: an illumination means, a beam splitting means, a lens array, a mask plate, a reflecting device, a photoelectric detector and a controller. The illumination means may generate a collimated beam, which is transmitted through the beam splitting means, focused by the lens array to the mask plate for spatial-filtering, and then delivered to the lithographic projection objective lens. The reflecting device reflects a focused beam passing through the lithographic projection objective lens to generate a reflected beam. The photoelectric detector detects an intensity of the reflected beam from the reflecting device after being spatial-filtered via the mask plate, and generates a beam intensity signal. The controller connects the workpiece table and the photoelectric detector, and is configured to control a movement of the workpiece table and/or collect the beam intensity signal generated by the photoelectric detector. By utilizing the movement of the reflecting device along a direction of the optical axis of the lithographic projection objective lens, the present disclosure is capable of detecting the position of the optimal focal plane of the lithographic projection objective lens according to a change in an intensity of reflected beam under each field of view.

The present disclosure will be further described in detail below with reference to the specific embodiments thereof and the accompanying drawings.

Hereinafter, some embodiments of the present disclosure will be described more fully with reference to the accompanying drawings, in which some but not all of embodiments are illustrated. In fact, various embodiments of the present disclosure can be implemented in many different forms and should not be construed as limited to the embodiments set forth herein. Rather, these embodiments are provided so that the present disclosure meets applicable legal requirements.

Figure 1:
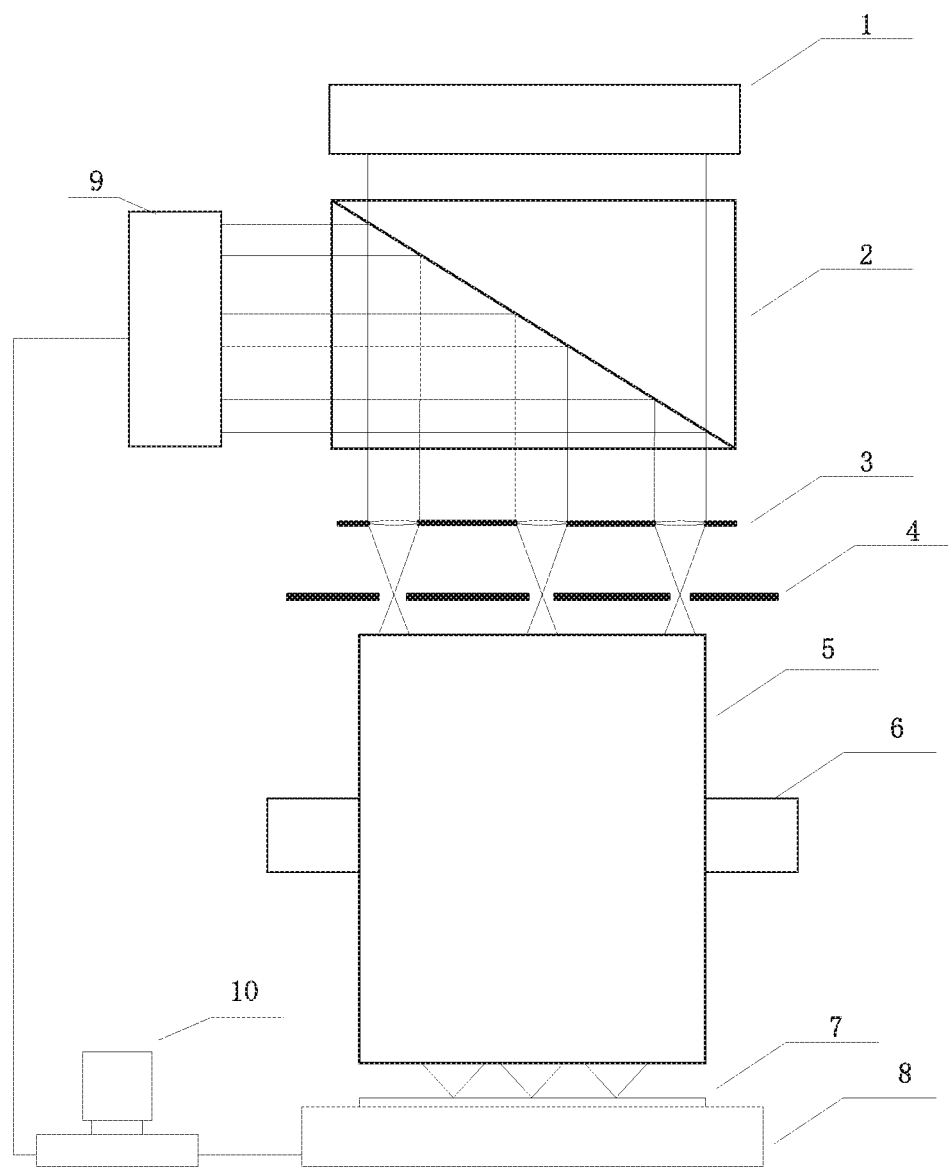
FIG. 1 shows a schematic structural view illustrating an apparatus for detecting an optimal focal plane of a lithographic projection objective lens in accordance with the present disclosure.

In an exemplary embodiment of the present disclosure, an apparatus for detecting an optimal focal plane of a lithographic projection objective lens is provided. FIG. 1 shows a schematic structural view illustrating the apparatus for detecting the optimal focal plane of the lithographic projection objective lens in accordance with the present disclosure. As shown in FIG. 1, the apparatus for detecting the optimal focal plane of the lithographic projection objective lens may include an illumination means 1, a beam splitting means 2, a lens array 3, a mask plate 4, a reflecting device 7, a photoelectric detector 9 and a controller 10. The illumination means 1 may generate a collimated beam, which is transmitted through the beam splitting means 2, focused by the lens array 3 to the mask plate 4 for spatial-filtering, and then delivered to the lithographic projection objective lens 5. The reflecting device 7 reflects a focused beam passing through the lithographic projection objective lens 5 to generate a reflected beam. The photoelectric detector 9 detects an intensity of the reflected beam from the reflecting device 7 after being spatial-filtered via the mask plate 4 and generates a beam intensity signal. The controller 10 connects the workpiece table 8 and the photoelectric detector 9, and is configured to control a movement of the workpiece table 8 and/or collect the beam intensity signal generated by the photoelectric detector 9.

Further, the lithographic projection objective lens 5 is mounted on a mounting means 6 for objective lens. The collimated beam emitted from the illumination means 1 is focused onto the mask plate 4 after passing through the beam splitting device 2 and the lens array 3. The mask plate 4 is provided with an array of pinholes which are at positions coincident with focal points of lenses of the lens array. Each of the pinholes may have a diameter slightly greater than a diameter of a spot focused by the lens, so that the focused beams can pass through the mask plate 4 to the lithographic projection objective lens 5, wherein each focused beam corresponds to one field of view.

Specifically, the mask plate 4 coincides with the object plane of the lithographic projection objective lens 5. The focused beam passing through the mask plate 4 is again focused by the lithographic projection objective lens 5 onto a surface of the reflecting device 7. The beam is reflected by the reflecting device 7, and then passes through the lithographic projection objective lens 5, the mask plate 4 and the lens array 3 again. After that, the beam is reflected by the beam splitting means 2 to the photoelectric detector 9. The photoelectric detector 9 and the workpiece table 8 are connected with the controller 10 and are controlled by the controller 10.

In particular, by controlling the workpiece table 8 to drive the reflecting device 7 to move along the direction of the optical axis of the lithographic projection objective lens 5 and collecting the position information of the reflecting device 7 and the signal intensity of the photoelectric detector 9 in real time, the controller 10 may establish a relationship between the position of the reflecting device 7 under each field of view and the reflected light intensity, to obtain the optimal focus position under each field of view, thereby calculating the position of the optimal focal plane of the lithographic projection objective lens 5.

Figure 2:
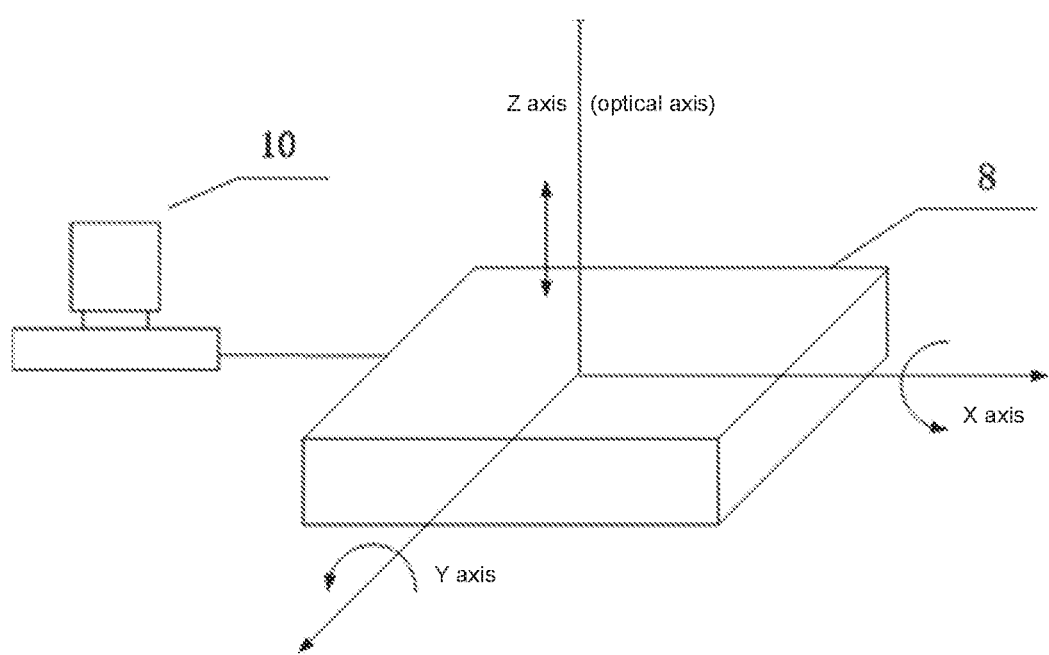
FIG. 2 shows a schematic view illustrating respective degrees of freedom on a workpiece table of the apparatus for detecting the optimal focal plane of the lithographic projection objective lens in accordance with the present disclosure.

Alternatively, the illumination means 1 may be a linearly polarized light source with a collimated beam expansion system, or may be a non-polarized light source with a collimated beam expansion system. The beam splitting means 2 may be a common beam splitting prism, or a combination of a polarizer, a polarization beam splitting prism and a λ/2 wave plate. The lens array 3 may be an array of the same lenses or an array of different lenses, as long as the focal lengths of the lenses are the same. The material for the lenses may be a glass or other optical materials such as a plastic. The mask plate 4 has an array of pinholes having a distribution form as same as the lens array 3, wherein each pinhole may have a diameter slightly greater than a diameter of a spot focused by the lens, and the area outside the pinholes is opaque. The mask plate 4 may be made of an opaque substrate material, or a light-transmitting substrate material coated with an absorbing film. The reflecting surface of the reflecting device 7 may be a planar mirror, a silicon wafer, or other planar substrate that can reflect an incident beam. The workpiece table 8 may be a three-axis precision motion table capable of adjusting an angle between the surface of the workpiece table 8 and the optical axis of the lithographic projection objective lens 5, and is also capable of moving along the direction of the optical axis. The workpiece table includes three degrees of freedom that respectively control the reflecting surface of the reflecting device to be perpendicular to the optical axis of the lithographic projection objective lens, and the axial movement of the reflecting device. FIG. 2 shows a schematic view illustrating respective degrees of freedom on the workpiece table of the apparatus for detecting the optimal focal plane of the lithographic projection objective lens in accordance with the present disclosure. As shown in FIG. 2, by establishing a coordinate system with the optical axis of the lithographic projection objective lens 5 being Z axis, the workpiece table 8 may be moved up and down along the Z axis, and rotated around the X axis and the Y axis, to obtain three degrees of freedom of the workpiece table 8. The photoelectric detector 9 may be a single photoelectric detector, such as a large area array CCD, a large area array CMOS, or may be an array of a plurality of energy detector. The controller 10 may be a single computer or a plurality of computers that communicate in real-time.

Figure 3:
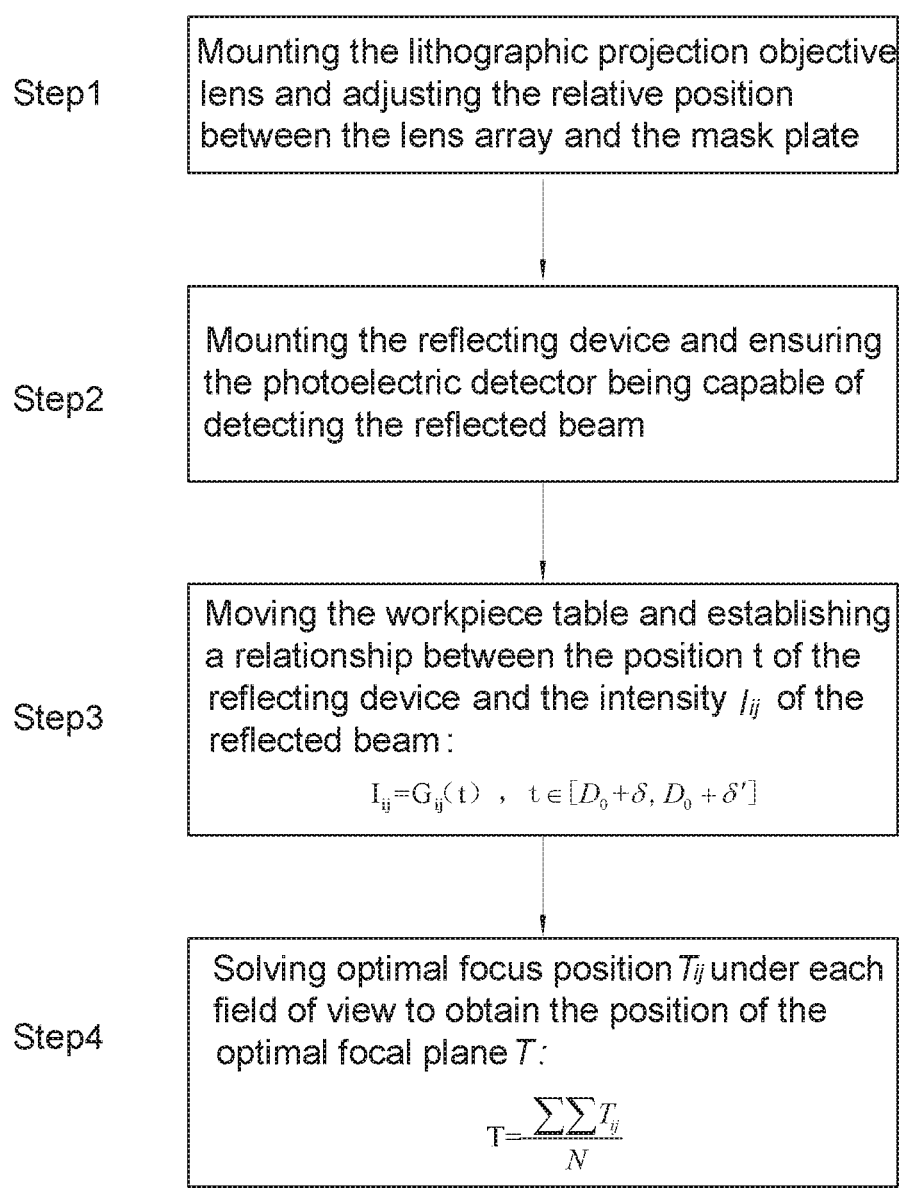
FIG. 3 shows a block schematic diagram illustrating a method for detecting an optimal focal plane of a lithographic projection objective lens in accordance with the present disclosure.

In an exemplary embodiment of the present disclosure, a method for detecting an optimal focal plane of a lithographic projection objective lens is also provided. FIG. 3 shows a block schematic diagram illustrating the method for detecting the optimal focal plane of the lithographic projection objective lens in accordance with the present disclosure. As shown in FIG. 3, the method may include the following steps:

Step 1: mounting a lithographic projection objective lens to be tested on the mounting means for objective lens, such that a direction of a beam emitted from the illumination means is in parallel to a direction of an optical axis of the lithographic projection objective lens, the planes of the lens array and the mask plate are perpendicular to the direction of the optical axis, and the mask plate is coincident with a focal plane of the lens array. Further, the array of pinholes on the mask plate is disposed at a position being coincident with the spot focused by the lens array.

Step 2: mounting the reflecting device on the workpiece table, such that the reflecting surface of the reflecting device is perpendicular to the optical axis of the lithographic projection objective lens, wherein a distance between the reflecting surface of the reflecting device and the lithographic projection objective lens is D, and a deviation δ between D and a nominal working distance $D_0$ of the lithographic projection objective lens is given by:

$$\delta = D = D_0.$$

The photoelectric detector is capable of detecting a reflected beam signal which is reflected by the reflecting device, transmitted by the lithographic projection objective lens, filtered by the mask plate, collimated by the lens array, and reflected by the beam splitting means.

It should be understood herein that the lithographic projection objective lens is composed of a plurality of lenses, the distance D is a distance between the reflecting surface of the reflecting device and the vertex of the farthest lens, and the nominal working distance $D_0$ is a distance between the designed optimal focal plane and the vertex of the farthest lens.

Step 3: controlling, by the controller, the workpiece table to move along the direction of the optical axis of the lithographic projection objective lens to decrease |δ|, until the distance between the reflecting surface of the reflecting device and the lithographic projection objective lens becomes D', so that $D_0$ is between D and D', wherein the deviation δ' between D' and the nominal working distance $D_0$ of the lithographic projection objective lens is given by:

$$\delta' = D' - D_0.$$

During the movement of the workpiece table, the controller collects, in real time, an intensity $I_{ij}$ of the reflected beam under each field of view detected by the photoelectric detector, and establishes a relationship $G_{ij}$ between the intensity $I_{ij}$ of the reflected beam and the distance t between the reflecting device under each field of view and the lithographic projection objective lens:

$$I_{ij} = G_{ij}(t), t \in [D_0 + \delta, D_0 + \delta'].$$

Wherein i and j refer to indices of fields of view and are determined by a distribution form of lenses on the lens array Step 4: for a single field of view $P_{ij}$, when the intensity $I_{ij}$ of the reflected beam is maximum, the distance between the reflecting device and the lithographic projection objective lens is an optimal focus position $T_{ij}$ for the corresponding field of view:

$$G_{ij}(t)|_{t=T_{ij}} = \text{Max}(I_{ij}).$$

The optimal focal plane of the lithographic projection objective lens is at a position T which is an average of the optimal focus positions $T_{ij}$ for respective fields of view, i.e.:

$$T = \frac{\sum\sum T_{ij}}{N}$$

wherein N is the number of fields of view, that is, the number of the lenses in the lens array.

The embodiments of the present disclosure have been described in detail with reference to the accompanying drawings. It should be noted that the implementations that are not shown or described in the drawings or the text of the specification are all known to those skilled in the art and are not described in detail. In addition, the above definitions of the various elements and methods are not limited to the specific structures, shapes or manners mentioned in the embodiments, and those skilled in the art can simply modify or replace them.

Based on the above description, those skilled in the art should have a clear understanding of the apparatus and the method for detecting the optimal focal plane of the lithographic projection objective lens according to the present disclosure.

In summary, the present disclosure provides an apparatus and a method for detecting an optimal focal plane of a lithographic projection objective lens, which may obtain the optimal focal plane of the lithographic projection objective lens according to an intensity change of the reflected beam under respective fields of view, by utilizing the movement of the reflecting device along the direction of the optical axis of the lithographic projection objective lens.

It should also be noted that directional terms mentioned in the embodiments, such as "upper", "lower", "front", "back", "left", "right", etc., only refer to the directions of the drawings, but are not intended to limit the scope of the present disclosure. Throughout the drawings, the same elements are denoted by the same or similar reference numerals. Conventional structures or configurations will be omitted when they may obscure the gist of the present disclosure.

Further, shapes and sizes of the components in the drawings do not reflect a true size or scale, but merely illustrate the contents of the embodiments of the present disclosure. In addition, in the claims, any reference sign placed between parentheses should not be construed as a limitation to the claims.

Unless indicated to the contrary, numerical parameters in the present specification and the appended claims are approximations, and can vary depending on the desired characteristics obtained by utilizing the present disclosure. In particular, all numbers expressing the content, reaction conditions, and the like, which are used in the specification and claims, are to be understood as being modified by the term "about" in all cases. In general, the meaning of such an expression is meant to encompass a variation of ±10% in some embodiments, a variation of ±5% in some embodiments, a variation of ±1% in some embodiments, and a variation of ±0.5% in some implementations.

Further, the term of "comprising" or "including" does not exclude the presence of an element or a step that is not recited in the claims. The word of "a" or "an" preceding an element does not exclude the presence of a plurality of such elements.

In addition, the order of the above steps is not limitative, and may be varied or rearranged depending on the desired design, unless specifically stated or the steps occurring necessarily in sequence. The above embodiments may be combined with each other or used in cooperation with other embodiments, in consideration of the design and reliability. That is, the technical features in different embodiments may be freely combined to form more embodiments.

Similarly, it should be understood that in order to simplify the present disclosure and to help understanding one or more of the various disclosed aspects, in the above description of the exemplary embodiments of the present disclosure, various features of the present disclosure are sometimes grouped together into a single embodiment, figure, or the description. However, the method disclosed is not to be interpreted as reflecting the intention that the claimed invention requires more features than those recited in the claims. Rather, as in the following claims, the disclosed aspects are less than all features of the single embodiment disclosed herein. Therefore, a claim following a specific embodiment is hereby explicitly incorporated into the specific embodiment, and each of the claims is considered as a separate embodiment of the present disclosure.

The objectives, technical solutions and beneficial effects of the present disclosure have been described in detail with reference to the specific embodiments of the present disclosure. It should be understood that the above embodiments are only the specific embodiments of the present disclosure, and are not intended to limit the present disclosure. Any modification, equivalent substitution, improvement, etc., made within the spirit and scope of the present disclosure, should be included within the scope of the present disclosure.

We claim:

1. An apparatus for detecting an optimal focal plane of a lithographic projection objective lens, comprising:
   an illumination means configured to generate a collimated beam;
   a beam splitting means configured to transmit the beam emitted from the illumination means;
   a lens array configured to focus the beam output from the beam splitting means;
   a mask plate, wherein the beam output from the lens array is focused on the mask plate and passes through the mask plate to be incident on the lithographic projection objective lens, and wherein the mask plate is configured to perform spatial-filtering;
   a reflecting device configured to reflect a focused beam passing through the lithographic projection objective lens to generate a reflected beam, so that the reflected beam is reflected on the beam splitting means, and is collimated through the lens array;
   a photoelectric detector configured to detect an intensity of the reflected beam from the reflecting device after being spatial-filtered via the mask plate and to generate a beam intensity signal; and
   a controller connected to the photoelectric detector and configured to control a movement of a workpiece table and/or collect the beam intensity signal generated by the photoelectric detector.

2. The apparatus of claim 1, further comprising:
a mounting means for objective lens, configured to fix the lithographic projection objective lens; and
the workpiece table connected to the controller and configured to adjust a posture and a position of the reflecting device.

3. The apparatus of claim 1, wherein the lens array is two-dimensionally distributed and has lenses with the same focal length, and wherein the lenses of the lens array are the same and/or different from each other.

4. The apparatus of claim 1, wherein the mask plate is provided with a pinhole array having a distribution form as same as the lens array.

5. The apparatus of claim 1, wherein the reflecting device has a reflecting surface made of any one of a glass plane, a silicon wafer or other coated planes.

6. The apparatus of claim 1, wherein the photoelectric detector comprises a single photoelectric detector and/or a plurality of photoelectric detectors arranged in an array.

7. The apparatus of claim 1, wherein the workpiece table has three degrees of freedom which respectively control a reflecting surface of the reflecting device to be perpendicular to an optical axis of the lithographic projection objective lens, and an axial movement of the reflecting device.

\* \* \* \* \*